(12) United States Patent
Saitoh

(10) Patent No.: US 11,264,473 B2
(45) Date of Patent: Mar. 1, 2022

(54) METHOD FOR MANUFACTURING SEMICONDUCTOR DEVICE

(71) Applicant: RENESAS ELECTRONICS CORPORATION, Tokyo (JP)

(72) Inventor: Toshiya Saitoh, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 58 days.

(21) Appl. No.: 16/444,942

(22) Filed: Jun. 18, 2019

(65) Prior Publication Data

US 2019/0393317 A1 Dec. 26, 2019

(30) Foreign Application Priority Data

Jun. 25, 2018 (JP) .............................. JP2018-119466

(51) Int. Cl.
| | |
|---|---|
| *H01L 21/3205* | (2006.01) |
| *H01L 21/4763* | (2006.01) |
| *H01L 29/423* | (2006.01) |
| *H01L 29/51* | (2006.01) |
| *H01L 21/027* | (2006.01) |
| *H01L 21/311* | (2006.01) |
| *H01L 21/3213* | (2006.01) |
| *H01L 21/02* | (2006.01) |
| *H01L 21/28* | (2006.01) |

(52) U.S. Cl.
CPC .... *H01L 29/42344* (2013.01); *H01L 21/0217* (2013.01); *H01L 21/0273* (2013.01); *H01L 21/02118* (2013.01); *H01L 21/02148* (2013.01); *H01L 21/02164* (2013.01); *H01L 21/02178* (2013.01); *H01L 21/31116* (2013.01); *H01L 21/31138* (2013.01); *H01L 21/31144* (2013.01); *H01L 21/32135* (2013.01); *H01L 29/40117* (2019.08); *H01L 29/513* (2013.01); *H01L 29/517* (2013.01); *H01L 29/518* (2013.01)

(58) Field of Classification Search
CPC ............. H01L 29/40117; H01L 29/513; H01L 29/517; H01L 29/518; H01L 21/02118; H01L 21/02148; H01L 21/02164; H01L 21/0217; H01L 21/02178; H01L 21/0273; H01L 21/31116; H01L 21/31138; H01L 21/31144; H01L 21/32135
USPC ........................................................ 438/591
See application file for complete search history.

(56) References Cited

U.S. PATENT DOCUMENTS

| 10,872,898 | B2 * | 12/2020 | Chen ................. H01L 27/11573 |
| 2014/0015035 | A1 * | 1/2014 | Takaishi .............. H01L 29/0692 |
| | | | 257/329 |
| 2017/0271162 | A1 | 9/2017 | Ogata et al. |

FOREIGN PATENT DOCUMENTS

JP 2017-168571 A 9/2017

* cited by examiner

*Primary Examiner* — Caleb E Henry
*Assistant Examiner* — Dilinh P Nguyen
(74) *Attorney, Agent, or Firm* — McDermott Will & Emery LLP

(57) ABSTRACT

A method of manufacturing a split-gate type nonvolatile memory improving reliability and manufacturing yield. In a method of manufacturing a split-gate type nonvolatile memory in which a memory gate electrode is formed prior to a control gate electrode, a protective film is formed to cover the gate insulating film exposed between control gate electrodes before unnecessary control gate electrodes are removed.

15 Claims, 15 Drawing Sheets

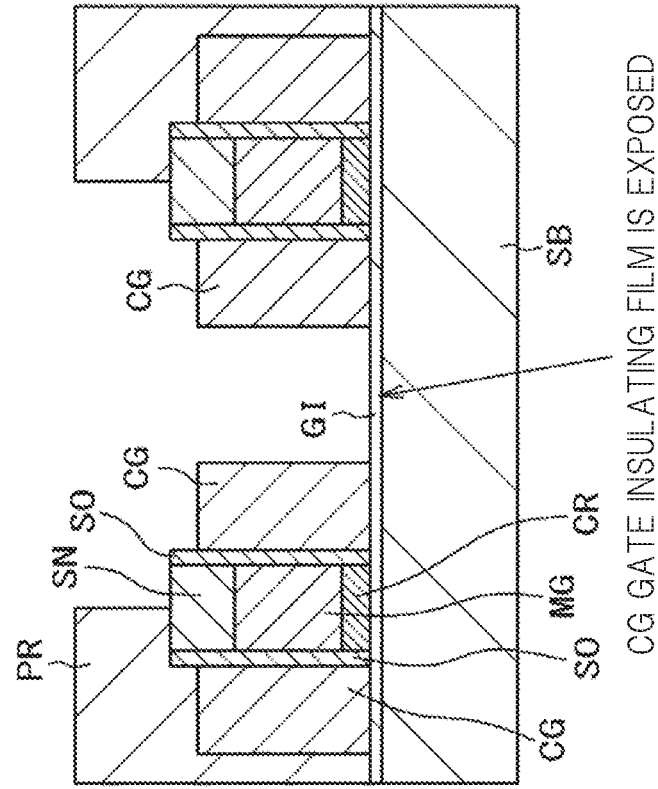
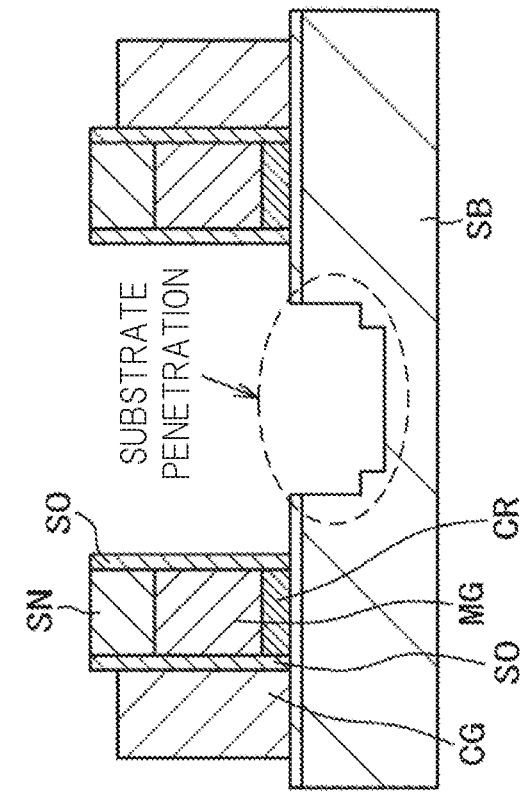

METHOD FOR MANUFACTURING SEMICONDUCTOR DEVICE

CROSS-REFERENCE TO RELATED APPLICATIONS

The disclosure of Japanese Patent Application No. 2018-119466 filed on Jun. 25, 2018 including the specification, drawings and abstract incorporated herein by reference in its entirety.

BACKGROUND

The present invention relates to a structure of a semiconductor device and a manufacturing method thereof, and more particularly, to a technique effective for application to a semiconductor device having a split-gate type nonvolatile memory.

EEPROM (Electrically Erasable and Programmable Read Only Memory) is widely adopted as a nonvolatile semiconductor memory device capable of electrically writing and erasing. These memory devices typified flash memories provide regions for charges in a gate insulating film of a MISFET, and store information by using a nonvolatile change of the threshold voltage by storing the charges. On the other hand, reading is performed by determining threshold voltages from MISFET channel current values. The storage of charges is realized by using a floating gate electrode surrounded by an insulating film or a trap level in an insulating film.

As an EEPROM, there is a split-gate type (SG type) cell using a MONOS (Metal-Oxide-Nitride-Oxide-Semiconductor) film. The split-gate type MONOS (SG-MONOS) is characterized in that high charge retention characteristics (reliability) by trapping charges in a silicon nitride film (SiN film) in a MONOS film of a memory gate MOS (MG-MOS) and high-speed and low-power-consumption reading can be realized by using a thin gate oxide film for a control gate MOS (CG-MOS).

As a background art of the present technical field, for example, there is a technique as disclosed in Japanese unexamined Patent Application publication No. 2017-168571. The patent Document discloses a manufacturing method of "MG-MOS prefabrication (so-called MG first)" in which a memory gate MOS (MG-MOS) is formed before a control gate MOS (CG-MOS) in a manufacturing process of a split-gate type MONOS (SG MONOS) structure.

SUMMARY

Incidentally, in the memory gate MOS (MG-MOS) of the split-gate type MONOS (SG-MONOS), by using a high dielectric constant film (High-k film) such as AHO (AlO/HfSiO/SiO) film instead of the ONO (Oxide-Nitride-Oxide) film, the performance can be greatly improved.

Since the High-k gate insulating film has a high dielectric constant and the physical film thickness of the gate insulating film can be increased without impairing the electric capacitance, direct tunneling leakage current due to quantum effects can be suppressed, and high performance can be expected by thinning the High-k gate insulating film.

When the AHO film is used instead of the ONO film in the manufacturing method of "MG-MOS pre-fabricated (MG first)", the underlayer structure is changed from the ONO film to the CG gate insulating film single layer (ISSG film: In-situ Steam Generation) in a step of removing the source side CC polysilicon. Since the CC gate insulating film is thin and damaged at the time of CC etching, the CG gate insulating film disappears simultaneously with CG polysilicon removal at the time of CG polysilicon removal on the source side by chemical dry etching, and there is a possibility that substrate penetration occurs.

Other problems and novel features will become apparent from the description of this specification and the accompanying drawings.

According to one embodiment of the present disclosure, in a method of manufacturing a split-gate type nonvolatile memory in which a memory gate electrode is formed prior to a control gate electrode, a protective film is formed to cover a gate insulating film exposed between the control gate electrodes before unnecessary control gate electrodes are removed.

According to the above-mentioned embodiment, in the method of manufacturing the split-gate type nonvolatile memory in which the memory gate electrode is formed prior to the control gate electrode, it is possible to achieve both the reliable removal of the unnecessary control gate electrode and the prevention of the substrate penetration due to the disappearance of the gate insulating film between the control gate electrodes.

As a result, the reliability and the manufacturing yield of the split-gate type nonvolatile memory can be improved.

BRIEF DESCRIPTION OF THE DRAWINGS

FIGS. 6A and 6B are cross-sectional views illustrating a problem in the manufacturing process of the semiconductor device.

DETAILED DESCRIPTION

Figure 1:
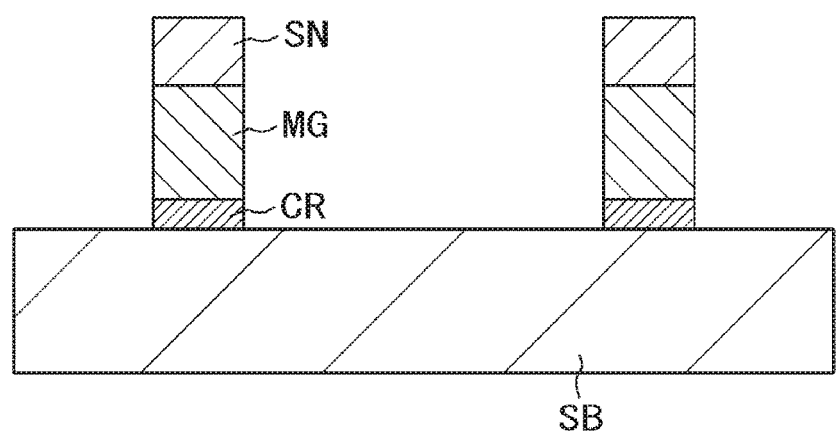
FIG. 1 is a cross-sectional view illustrating a process of manufacturing a semiconductor device.

Embodiments will be described below with reference to the drawings. In the drawings, the same components are denoted by the same reference numerals, and detailed descriptions of the same components are omitted.

First, with reference to FIGS. 1 to 5, and FIGS. 6A and 6B, a method of manufacturing a split-gate type nonvolatile memory and its problems will be described. FIGS. 1 to 5 are cross-sectional views illustrating a manufacturing process of a main structure of a split-gate type cell, and FIGS. 6A and 6B are views conceptually showing a problem of substrate penetration during chemical dry etching for CG polysilicon removal performed between FIG. 4 and FIG. 5.

Here, an AHO (AlO/HfSiO/SiO) film is used as an example of a charge storage film (trapping film) CR of the memory gate MOS (MG-MOS), but an ONO (Oxide-Nitride-Oxide) film is also available as a charge storage film (trapping film) CR of the memory gate MOS (MG-MOS).

As shown in FIG. 1, a stacked film structure of an AHO (AlO/HfSiO/SiO) film serving as a charge storage film (a trapping film) CR, a polysilicon (Poly-Si) film serving as a memory gate electrode MG, and a silicon nitride film ($Si_3N_4$ film) SN serving as a cap insulating film formed on a main surface of a semiconductor substrate SB in order from the bottom layer, and then memory gate electrodes MG are formed by anisotropic etching using resist masks (not shown).

Figure 2:
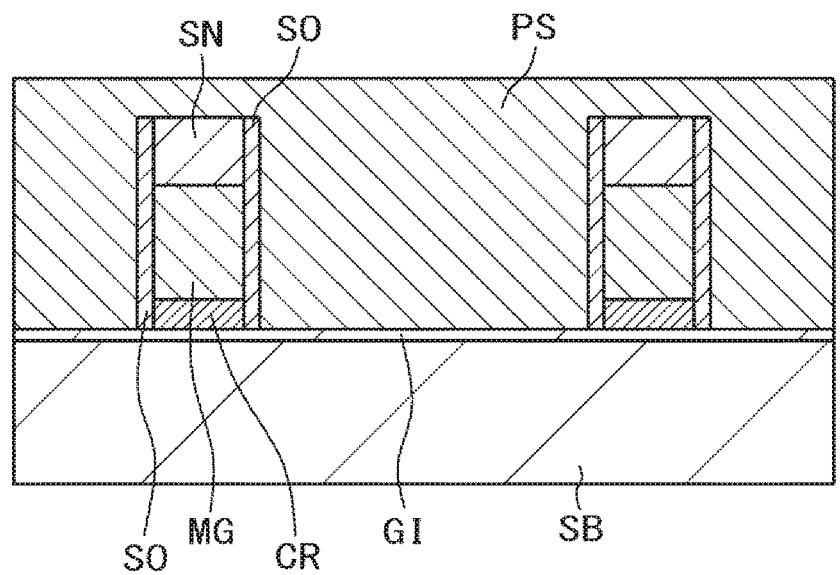
FIG. 2 is a cross-sectional view illustrating a process of manufacturing a semiconductor device following FIG. 1.

Next, shown in FIG. 2, sidewalls made of oxynitride films (SiON films) SO are formed on the sidewalls of the memory gate electrodes MG, and then a gate insulating film GI and a polysilicon film PS are formed. As the gate insulating film GI, an ISSG film (In-situ Steam Generation) capable of forming a thin gate oxide fill ($SiO_2$) is used.

Figure 3:
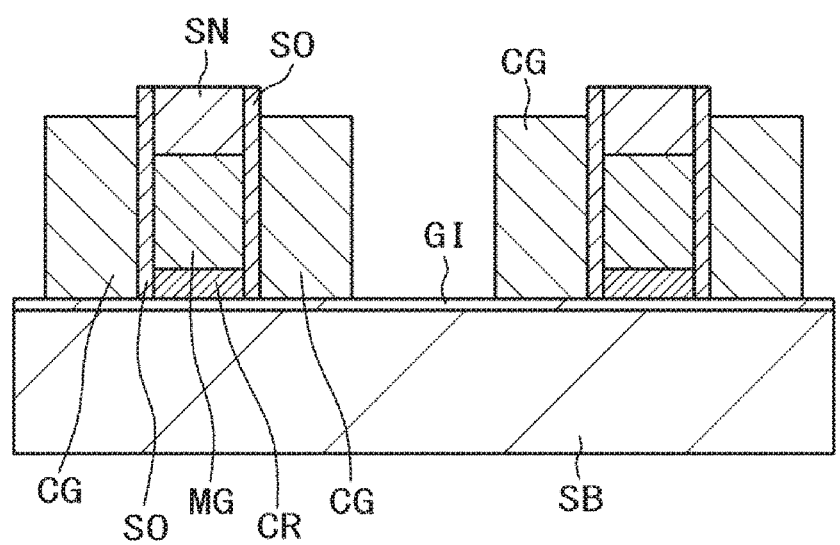
FIG. 3 is a cross-sectional view illustrating a process of manufacturing a semiconductor device following FIG. 2.

Subsequently, as shown in FIG. 3, the polysilicon film PS is anisotropically etched back to form control gate electrodes CG having a sidewall shape on both sides of the memory gate electrodes MG. At this time, the gate insulating film (ISSG film) GI is exposed between the control gate electrodes CG adjacent to each other.

Figure 4:
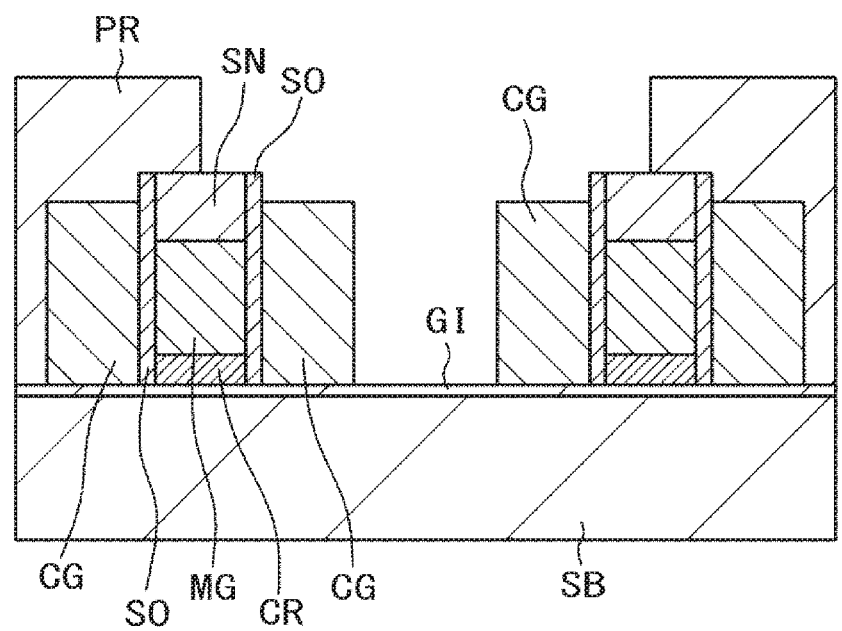
FIG. 4 is a cross-sectional view illustrating a process of manufacturing a semiconductor device following FIG. 3.

Next, as shown in FIG. 4, after a photoresist film PR is applied on the main surface of the semiconductor substrate SB, a resist mask for selectively removing the unnecessary control gate electrodes CG (polysilicon PS) on the source side (drain side depending on the specification of the memory cell) is formed by photolithography.

Figure 5:
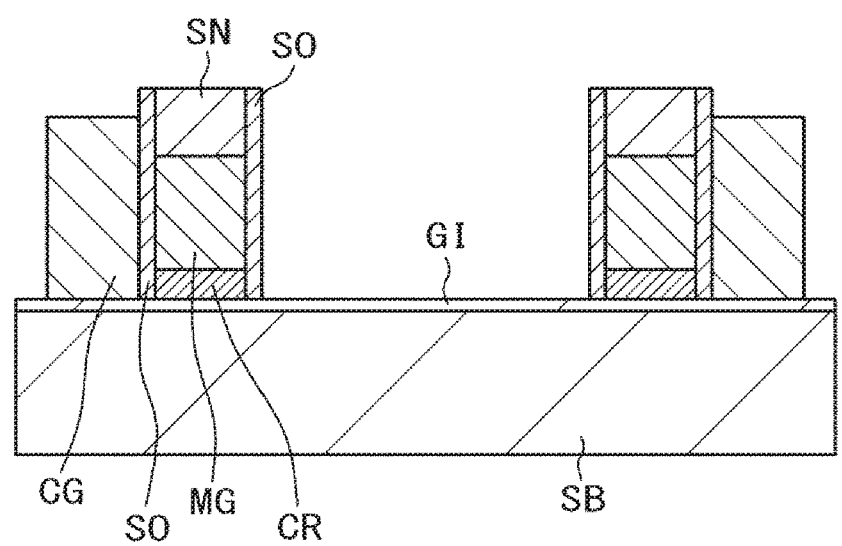
FIG. 5 is a cross-sectional view illustrating a process of manufacturing a semiconductor device following FIG. 4.

Subsequently, as shown in FIG. 5, the unnecessary (source side) control gate electrodes CG (polysilicon PS) are removed by etching (hereinafter also referred to as RCG etching) using the resist mask formed in the step of FIG. 4. In this RCG etching, the control gate electrodes CG (polysilicon PS) are isotropically etched using chemical dry etching, but the gate insulating film (ISSG film) GI exposed between the control gate electrodes CG adjacent to each other is left.

As described above, the split-gate type (SG type) cell structure is formed by removing the control gate electrodes CG (polysilicon PS) on one side (source side) of each of the memory gate electrodes MG by the steps shown in FIGS. 1 to 5.

With reference to FIGS. 6A and 6B, problems in forming a split-gate cell structure will be described. FIG. 6A illustrates a state before an RCG etching for removing an unnecessary (source side) control gate electrodes CG is performed. FIG. 6A is a view in which the configuration of the semiconductor substrate SB main body (Si-Sub) is added to FIG. 4 in order to make the problem easier to understand. FIG. 6B illustrates a state after the RCG etching.

As described above, when unnecessary (source side) control gate electrodes CG (polysilicon PS) are removed, the gate insulating film (ISSG film) GI between the control gate electrode CG patterns is exposed. The gate insulating film (ISSG film) GI is as thin as 4 nm or less, and is damaged by anisotropic etching at the time of memory gate electrode MG processing or anisotropic etching tack at the time of control gate electrode CG processing. Therefore, unnecessary control gate electrodes CG (polysilicon PS) are removed at the time of RCG etching, and at the same time, the gate insulating film (ISSG film) GI tends to disappear, and there is a possibility that substrate penetration occurs as shown in FIG. 6B.

Even when the RCG etching (chemical dry etching) condition is reviewed and the condition having higher etching selectivity of the control gate electrode CG (polysilicon PS) to the gate insulating film (ISSG film) GI is applied, the gate insulating film (ISSG film) GI is exposed in the same structure, and therefore damage to the gate insulating film (ISSG film) GI cannot be ignored.

First Embodiment

Next, with reference to FIGS. 7 to 15, the structure of the split-gate type nonvolatile memory cell of the first embodiment and the manufacturing method thereof will be described. In the semiconductor device of the present embodiment, a memory cell including a transistor having an AHO (AlO/HfSiO/SiO) film or an ONO (Oxide-Nitride-Oxide) film as a charge storage film (trapping film) exists on a semiconductor substrate. The memory cell includes a control transistor (CG-MOS) and a memory transistor (MG-MOS).

In the following description, an AHO (AlO/HfSiO/SiO) film is used as the charge storage film (trapping film) CR of the memory transistor (MG-MOS), but an ONO (Oxide-Nitride-Oxide) film is also available as a charge storage film.

The steps up to the formation of the control gate electrode CG are the same as the steps of the manufacturing method shown in FIGS. 1 to 3, and therefore a repetitive description thereof is omitted.

Figure 7:
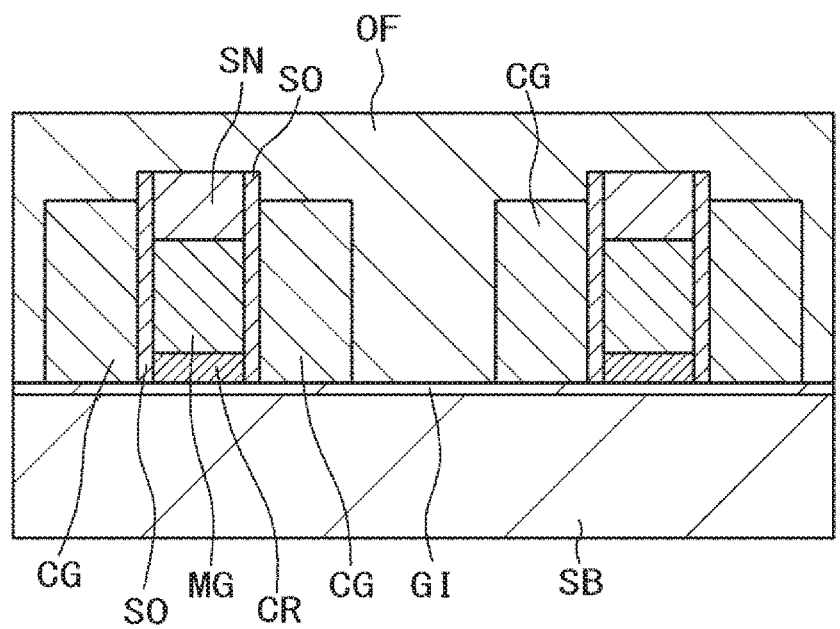
FIG. 7 is a cross-sectional view illustrating a process of manufacturing a semiconductor device according to one embodiment of the present invention.

As shown in FIG. 7, after the control gate electrodes CG (polysilicon PS) are processed, an organic film OF is formed (applied) on the semiconductor substrate SB so as to fill the spaces between the control gate electrodes CG adjacent to each other. The organic film OF functions as a protective film for protecting the gate insulating film (ISSG film) GI exposed between the control gate electrodes CG. For the organic film OF, for example, a material made of an organic resin COH (a resin containing an alcoholic hydroxyl group C—OH) used as a lower layer antireflection film in a semiconductor manufacturing Process (manufactured by Nissan Chemical Co., Ltd.: ARC29A or Brewer Science Co., Ltd.: DUV42) or a via fill material used as an embedding material when forming a damascene wiring pattern on an interlayer insulating film is used.

Figure 8:
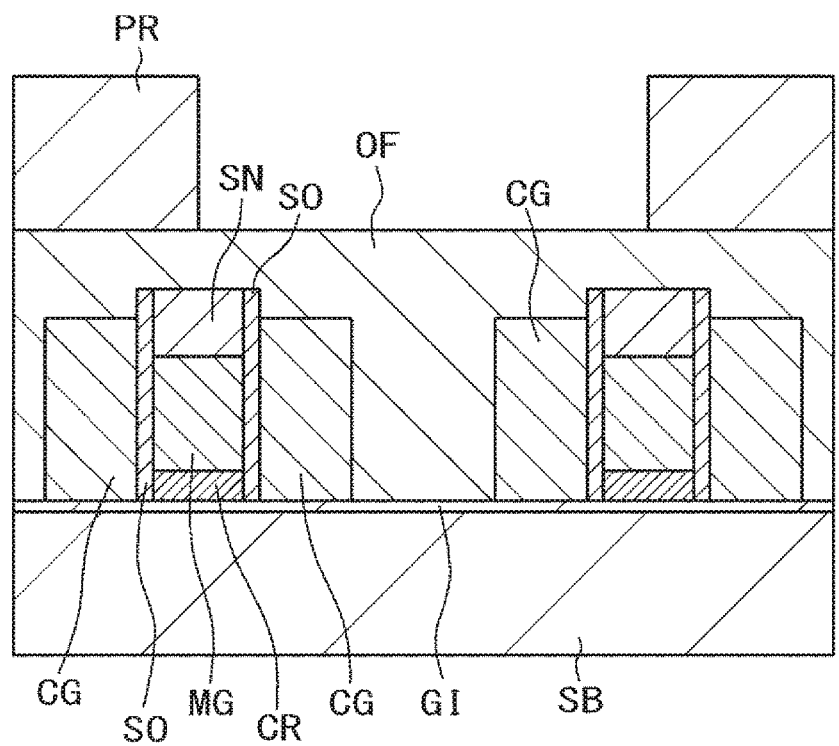
FIG. 8 is a cross-sectional view illustrating a process of manufacturing a semiconductor device following FIG. 7.

Next, as shown in FIG. 8, after a photoresist film PR is applied on the organic film OF, a resist mask for selectively removing the unnecessary control gate electrodes CG (polysilicon PS) on the source side (drain side depending on the specification of the memory cell) formed by photolithography.

Here, film thickness values serving as standards for the respective configurations of FIG. 8 are as follows.

As described above, the gate insulating film GI of the control transistor (CG-MOS) is an extremely thin silicon oxide film ($SiO_2$) formed by oxidizing the surface of the semiconductor substrate SB by the ISSG (In-situ Steam Generation) method, and the thickness of the gate insulating film GI of the control transistor (CG-NOS) is preferably 4 nm or less in order to ensure the performance of the control transistor (CG-MOS).

The memory gate MOS (MG-MOS) has an AHO (AlO/HfSiO/SiO) film of 15 nm to 50 nm, a memory gate electrode MG (polysilicon film) of 40 nm to 100 nm, and a silicon nitride film SN of 20 nm to 100 nm in order from the lower layer. The control gate electrode CG (polysilicon PS) has a thickness of 50 nm to 80 nm. The sidewall protective film made of the oxynitride film SO formed on the sidewall of the memory gate electrode MG has a thickness of 5 nm to 15 nm. The organic film (protective film) OF is 150 nm to 200 nm, and the photoresist (film) PR is 370 nm to 400 nm.

Figure 9:
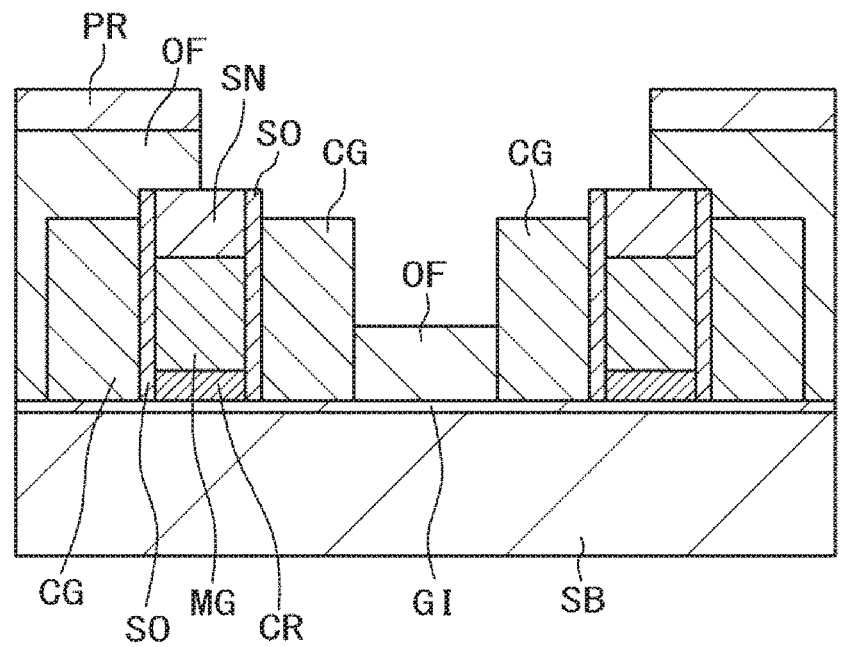
FIG. 9 is a cross-sectional view illustrating a process of manufacturing a semiconductor device following FIG. 8.

Subsequently, as shown in FIG. 9, using the photoresist PR as a mask, the organic film OF is etched back by using an anisotropic polysilicon etching apparatus until the top portions (upper surfaces) and parts of the side surfaces of the control gate electrodes CG (polysilicon PS) are exposed. At this time, mixed gas obtained by adding sulfurous acid gas ($S_2$) to oxygen gas ($O_2$) is selected as the etching gas.

The organic film OF is etched back to be lower than the height (for example, 180 nm to 200 nm) of the control gate electrode CG (polysilicon PS), for example to be half the height of the control gate electrode CG to expose the control gate electrode CG (polysilicon PS) portion. However, in removing the control gate electrodes CG (polysilicon PS), since the organic film OF disappears by about 7 nm to 8 nm, it is necessary to leave the organic film OF by 10 nm or more (a film thickness of 5% or more of the height of the control gate electrode CG).

As the anisotropic polysilicon etching apparatus, an ICP plasma apparatus (Inductively Coupled Plasma:) or an ECR plasma apparatus (Electron Cyclotron Resonance) is used.

Figure 10:
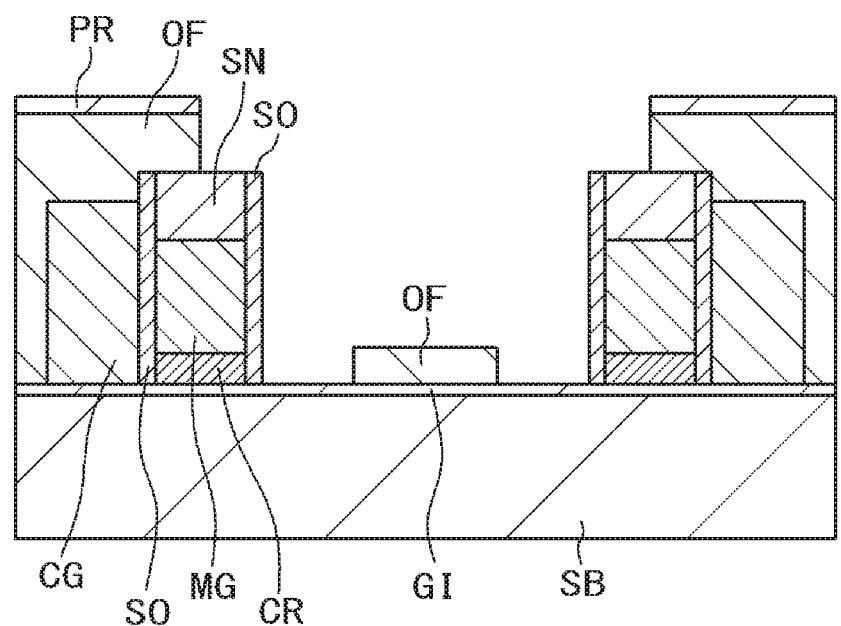
FIG. 10 is a cross-sectional view illustrating a process of manufacturing a semiconductor device following FIG. 9.

Next, as shown in FIG. 10, the semiconductor substrate SB is moved from the etching chamber of the anisotropic polysilicon etching apparatus to the etching chamber of the chemical dry etching apparatus, and chemical dry etching, which is isotropic etching, is performed while being covered with the resist mask PR and the organic film OF to remove the exposed control gate electrodes CG (polysilicon PS). As the etching gas at this time, a $CF_4$ gas containing carbon tetrafluoride ($CF_4$) or oxygen (O) is selected.

The organic film OF on the gate insulating film (ISSG film) GI may disappear at the same time as the control gate electrode CG (polysilicon PS) as long as the gate insulating film (ISSG film) GI can be protected during chemical dry etching of the exposed control gate electrodes CG (polysilicon PS).

Figure 11:
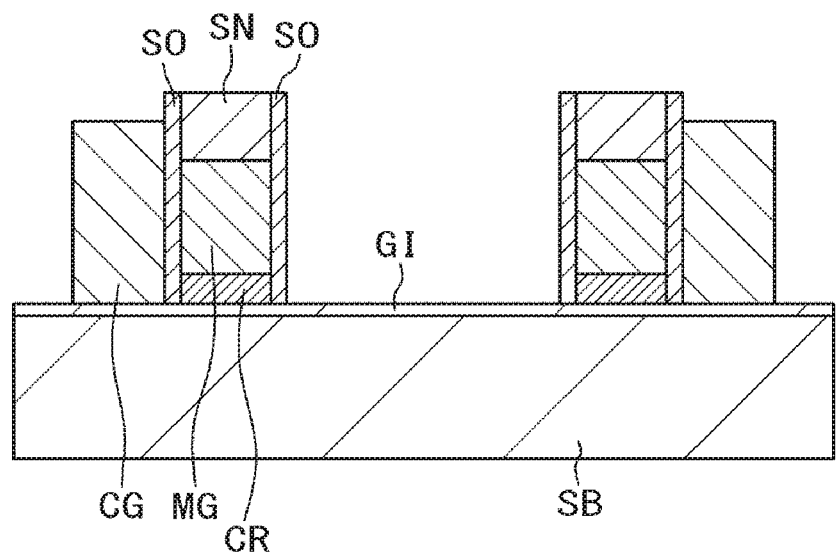
FIG. 11 is a cross-sectional view illustrating a process of manufacturing a semiconductor device following FIG. 10.

Subsequently, as shown in FIG. 11, the semiconductor substrate SB is moved to the ashing chamber of the ashing apparatus, and the photoresist PR and the organic film OF remaining on the semiconductor substrate SB are removed.

Figure 12:
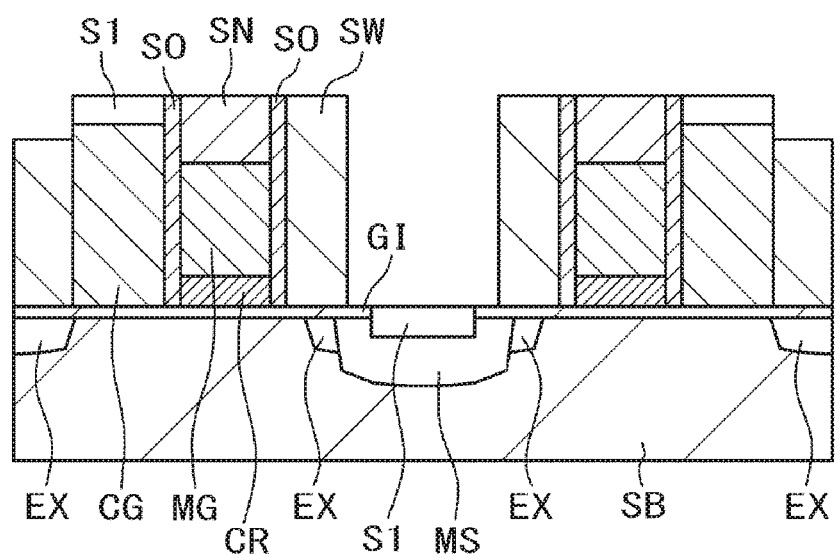
FIG. 12 is a cross-sectional view illustrating a process of manufacturing a semiconductor device following FIG. 11.

Next, as shown in FIG. 12, extension regions EX serving as low-concentration impurity drains (Lightly Doped Drain) are formed in the semiconductor substrate SB between memory gate electrodes MG adjacent to each other by photolithography and ion implantation. At this time, Halo implantation or Pocket implantation may be included (not shown), the implantation condition of the source region and the drain region may be different (not shown).

Subsequently, after a silicon nitride film is formed on the semiconductor substrate SB, sidewalls SW made of a silicon nitride film are formed on the sidewalls of the memory gate electrode MG and the control gate electrode CG by etch back.

Thereafter, source/drain regions (here, source regions MS) are formed in the semiconductor substrate SB between the memory gate electrodes MG adjacent to each other by photolithography and ion implantation, and a metal silicide layer S1 is formed on the semiconductor substrate SB. At this time, the metal silicide layer S1 is also formed on the surface of the polysilicon PS of the control gate electrode CG.

Figure 13:
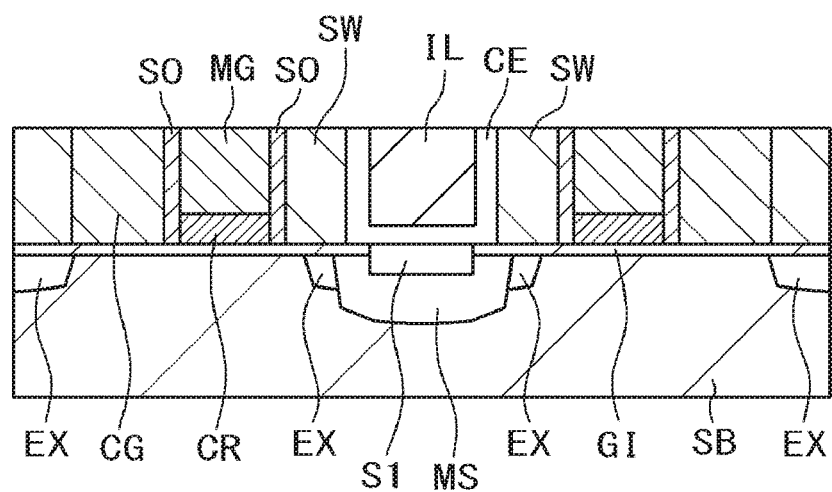
FIG. 13 is a cross-sectional view illustrating a process of manufacturing semiconductor device following FIG. 12.

Next, as shown in FIG. 13, a silicon nitride film CE having a thickness of, for example, about 10 nm to 40 nm is formed as a CESL film (contact etching stopper liner film) on the semiconductor substrate SB by a CVD method, and then a P-TEOS oxide film or $O_3$-TEOS oxide film having a thickness of, for example, about 50 nm to 150 nm is formed as an interlayer insulating film IL by a CVD method. Thereafter, CMP polishing is performed to expose the surfaces of the polysilicon film PS of the memory gate electrode MG and the control gate electrode CG.

Figure 14:
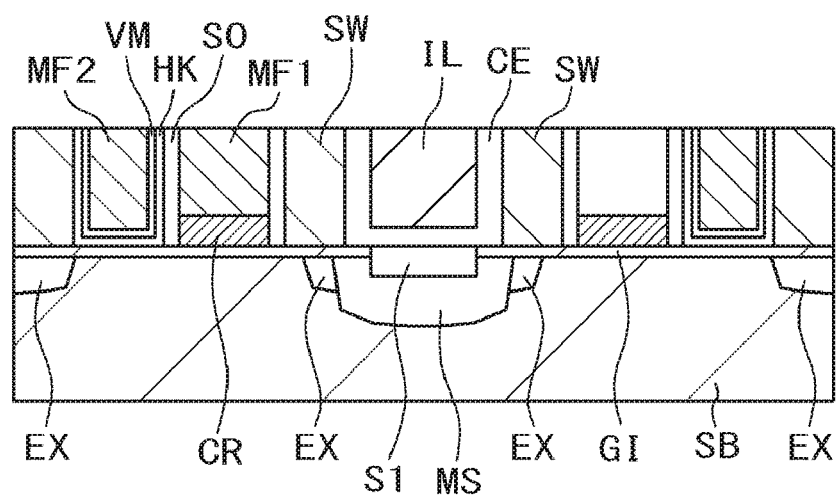
FIG. 14 is a cross-sectional view illustrating a process of manufacturing a semiconductor device following FIG. 13.

Next, as shown in FIG. 14, after the polysilicon film PS of the control gate electrode CG is selectively removed by wet etching, a High-k film HK (for example, hafnium oxide ($HfO_2$), zirconium oxide ($ZrO_2$), aluminum oxide ($Al_2O_3$), or the like) is formed on the semiconductor substrate SB to a thickness of about 1 nm to 3 nm by, for example, an ALD method so as to fill the trench portion after the polysilicon film PS of the control gate electrode CG is removed. A titanium nitride film (TiN) serving as a Vth control metal film (VM) is formed on the High-k film (HK) to a thickness of about 2 nm to 3 nm by, for example, a PVD method.

Subsequently, a metal film MF2 of aluminum (Al) or the like is filled in the above-mentioned trench portion on the semiconductor substrate SB by, for example, a PVD method, and then planarization is performed by CMP polishing, so that a metal film is left in the trench and a metal gate electrode (control gate electrode CG) made of the metal film MF2 is formed.

Thereafter, the polysilicon film PS of the memory gate electrode MG is selectively removed by wet etching, a metal film MF1 of aluminum (Al) or the like is filled in the above-mentioned trench portion by, for example, a PVD method on the semiconductor substrates SB so as to fill the trench portion after the polysilicon film PS of the memory gate electrode MG is removed. Subsequently, planarization is performed by CMP polishing, thereby leaving a metal film in the trench and forming a metal gate electrode (memory gate electrode MG) made of the metal film MF1.

Figure 15:
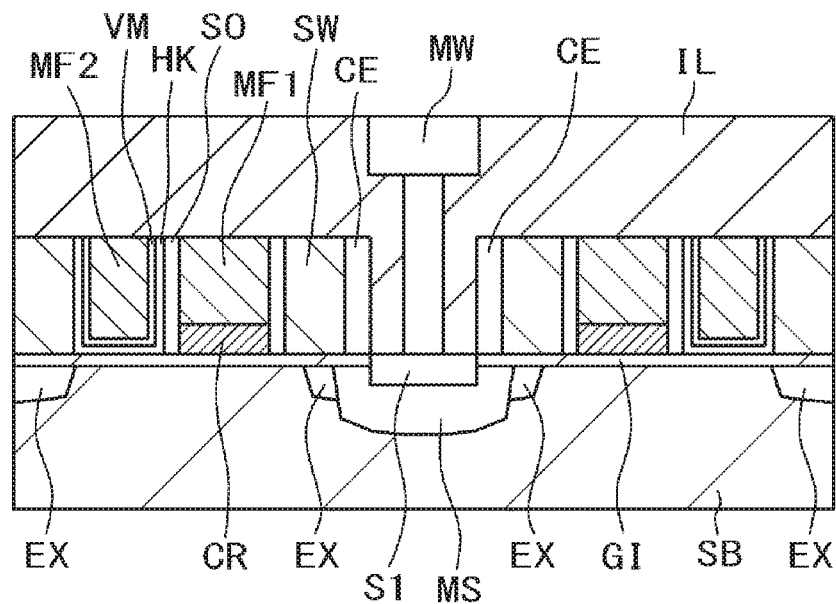
FIG. 15 is a cross-sectional view illustrating a process of manufacturing a semiconductor device following FIG. 14.

Next, as shown in FIG. 15, an interlayer insulating film IL made of a P-TEOS oxide film or an $O_3$-TEOS oxide film is formed on the semiconductor substrate SB by, for example, a CVD method. Subsequently, contact hole is formed by photolithography and dry etching. A conductive contact plug (via) CP made of tungsten (W) or the like is formed in the contact hole by, for example, CVD and CMP polishing as a conductor portion for connection. Thereafter, wirings MW (W wirings, Al wirings, Cu wirings) are formed by photolithography, dry etching, or wiring damascene techniques.

By the manufacturing method described above, the memory cell structure of the split-gate type nonvolatile memory of the present embodiment shown in FIG. 15 is completed.

According to the memory cell structure and the manufacturing method of the present embodiment, the organic film OF is formed between the control gate electrodes CG adjacent to each other, and the gate insulating film (ISSG film) GI between the control gate electrodes CG is protected, whereby damage to the gate insulating film (ISSG film) GI at the time of removing the control gate electrodes CG is suppressed, and the polysilicon film PS of the control gate electrode CG can be reliably removed and the gate insulating film (ISSG film) GI can be protected at the same time.

In the present embodiment, the polysilicon film PS of each of the control gate electrode CG and the memory gate electrode MG is replaced with the metal films MF1 and MF2 of aluminum (Al) in the step shown in FIG. 14 to form the metal gate electrode, but the step shown in FIG. 14 may be omitted and both the control gate electrode CG and the memory gate electrode MG may be used as the polysilicon electrode formed of the polysilicon film PS.

Second Embodiment

Figure 16:
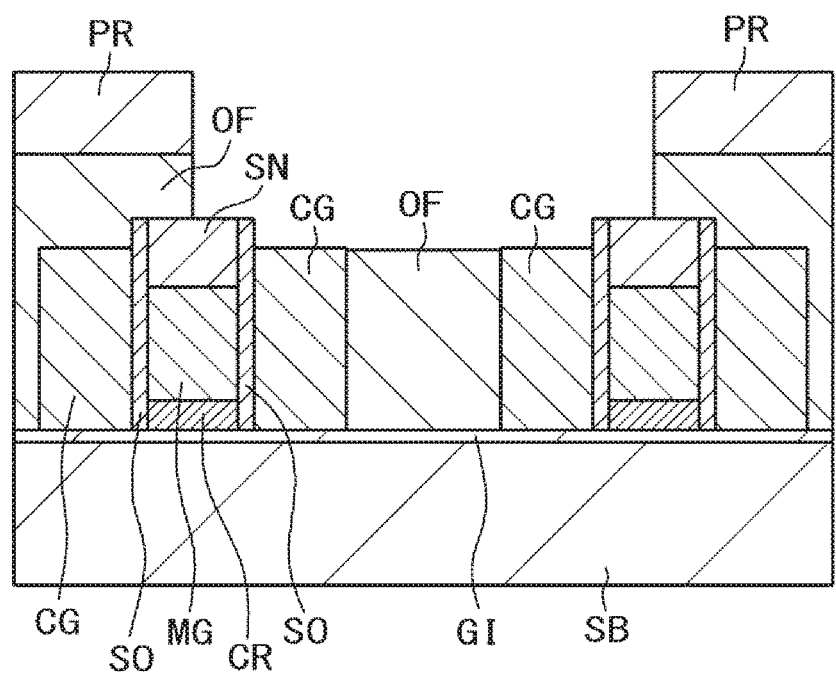
FIG. 16 is a cross-sectional view illustrating a process of manufacturing a semiconductor device according to one embodiment of the present invention.
Figure 17:
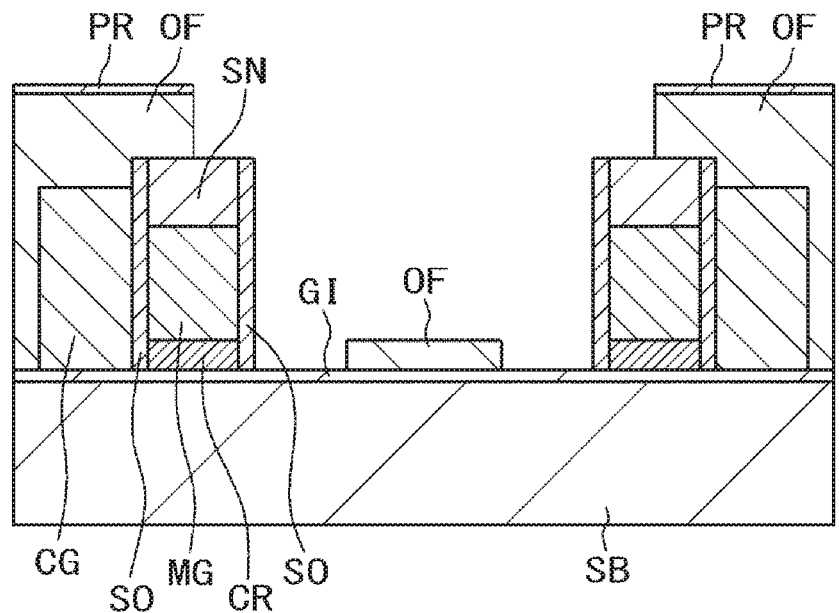
FIG. 17 is a cross-sectional view illustrating a process of manufacturing a semiconductor device following FIG. 16.
Figure 18:
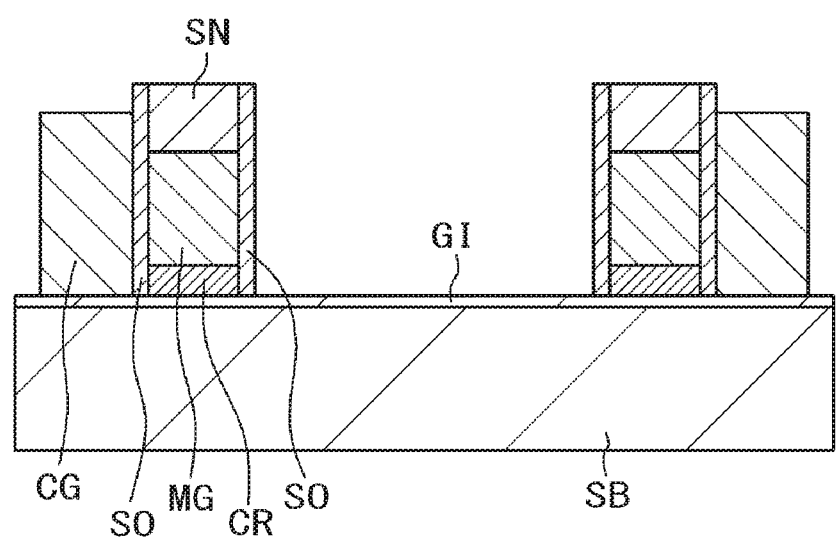
FIG. 18 is a cross-sectional view illustrating a process of manufacturing a semiconductor device following FIG. 17.

With reference to FIGS. 16 to 18, a method of manufacturing the split-gate nonvolatile memory cell of the second embodiment will be described. In the present embodiment, since the manufacturing process until the resist mask PR for selectively removing the unnecessary control gate electrodes CG (polysilicon PS) is formed on the organic film OF is the same as that in FIG. 8 of first embodiment, a repetitive description thereof is omitted.

In the first embodiment, after a resist mask PR is formed on the organic film OF (FIG. 8), the organic film OF is etched back by an anisotropic polysilicon etching apparatus until the top portions (upper surfaces) and parts of the side surfaces of the control gate electrodes CG (polysilicon PS) are exposed.

On the other hand, in the present embodiment, as shown in FIG. 16, the etch back is terminated when the top portions (upper surfaces) of the control gate electrodes CG (polysilicon PS) are exposed. For example, the organic film OF is etched back until the height of the organic film OF between the control gate electrodes CG becomes about 180 nm to 200 nm. As in first embodiment, an anisotropic polysilicon etching apparatus such as an ICP plasma apparatus or an ECR plasma apparatus is used for this etch back. At this time, mixed gas obtained by adding sulfurous acid gas ($S_2$) to oxygen gas ($O_2$) is selected as the etching gas.

Next, as shown in FIG. 17, similarly to the etching back of the organic film OF, the unnecessary control gate electrodes CG (polysilicon PS) on the source side (drain side depending on the specification of the memory cell) are removed by using an anisotropic polysilicon etching apparatus such as an ICP plasma apparatus or an ECR plasma apparatus.

At this time, in the anisotropic polysilicon etching apparatus, the gas system introduced into the etching chamber is switched, the control gate electrodes CG (polysilicon PS) are removed, and the etching is stopped by the gate insulating film (ISSG film) GI below the control gate electrode CG. As the etching gas at this time, gas having a high etching selectivity ratio of the control gate electrode CG (polysilicon film) to the gate insulating film GI (silicon oxide film), for example, mixed gas in which oxygen ($O_2$) is added to hydrogen bromide (HBr) is selected.

The organic film OF on the gate insulating film (ISSG Film) GI may disappear at the same time as the control gate electrode CG (polysilicon PS) as long as the gate insulating film (ISSG film) GI can be protected when the exposed control gate electrodes CG (polysilicon PS) are etched away.

Subsequently, as shown in FIG. 18, the resist mask PR and the organic film OF are removed by an ashing apparatus, for example, an ashing chamber installed in-line in an anisotropic polysilicon etching apparatus.

The subsequent steps are the same as the steps shown in FIGS. 12 to 15 of the first embodiment, and therefore a repetitive description thereof is omitted.

When the gate insulating film (ISSG film) GI between the control gate electrodes CG is protected by the organic film OF and the control gate electrodes CG are removed by isotropic chemical dry etching as in the first embodiment, the etching from the sidewalls of the control gate electrodes CG is hindered and the control gate electrodes CG (polysilicon PS) may be insufficiently removed. If the etching time is simply lengthened in order to completely remove the control gate electrodes CG (polysilicon PS), there is a possibility that the etching time becomes a trade-off with the substrate penetration due to the disappearance of the organic film OF and the gate insulating film (ISSG film) GI.

On the other hand, as in the present embodiment, by applying an anisotropic polysilicon etching apparatus having an advantage in an etching selectivity ratio of polysilicon to a silicon oxide film, it is possible to achieve both reliable removal of the unnecessary control gate electrodes (polysilicon PS) and prevention of substrate penetration.

Further, by removing the resist mask PR in the ashing chamber installed in-line in the anisotropic polysilicon etching apparatus, it is possible to consistently process the etching back of the organic film OF, the removal of the unnecessary control gate electrodes CG (polysilicon PS), and the removal of the organic film OF and the resist mask PR in the anisotropic polysilicon etching apparatus.

The present embodiment is advantageous in terms of manufacturing yield, work efficiency, and processing time as compared with As in Example 1, performing the etching back of the organic film OF by an anisotropic polysilicon etching apparatus (FIG. 9), performing the removal of the unnecessary control gate electrodes CG (polysilicon PS) by a chemical dry etching apparatus (FIG. 10), and performing the removal of the photoresist PR and the organic film OF by an ashing apparatus (FIG. 11), as in the first embodiment.

Third Embodiment

With reference to FIGS. 19 to 23, a method of manufacturing a split-gate type nonvolatile memory cell of third embodiment will be described. In the present embodiment, the steps up to the formation of the control gate electrode CG are the same as the steps of the manufacturing method shown in FIGS. 1 to 3, and therefore, a repetitive description thereof is omitted.

In the first embodiment, after the control gate electrode CG (polysilicon PS) is processed, an organic film OF serving as a protective film of the gate insulating film (ISSG film) GT is formed (applied) on the semiconductor substrate SB so as to fill space between the control gate electrodes CG adjacent to each other, as shown in FIG. 7.

Figure 19:
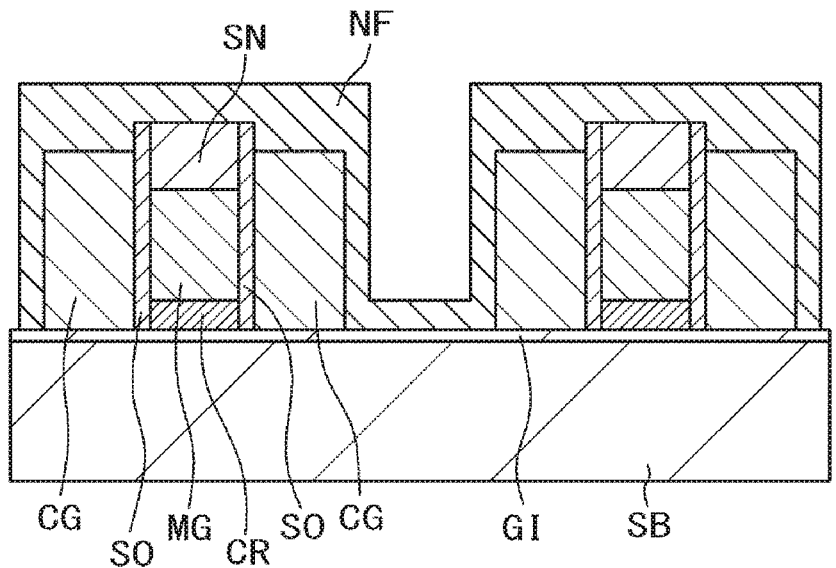
FIG. 19 is a cross-sectional view illustrating a process of manufacturing a semiconductor device according to one embodiment of the present invention.

On the other hand, in the present embodiment, as shown in FIG. 19, instead of the organic film OF, a silicon nitride film NF serving as a protective film for the gate insulating film (ISSG film) GI is formed on the semiconductor substrate SB so as to fill the space between the control gate electrodes CG adjacent to each other. That is, after the control gate electrode CG (polysilicon PS) is processed, the silicon nitride film NF is formed to be thicker than the height (for example, 180 nm to 220 nm) of the control gate electrode CG (polysilicon PS) (the height from the main surface of the semiconductor substrate SB to the surface of the silicon nitride film NF is higher than the control gate electrode CG). The silicon nitride film NF is formed to a thickness of 20 nm to 30 nm using, for example, a DCS-SiN film (a SiN film made of dichlorosilane ($SiH_2Cl_2$)).

Figure 20:
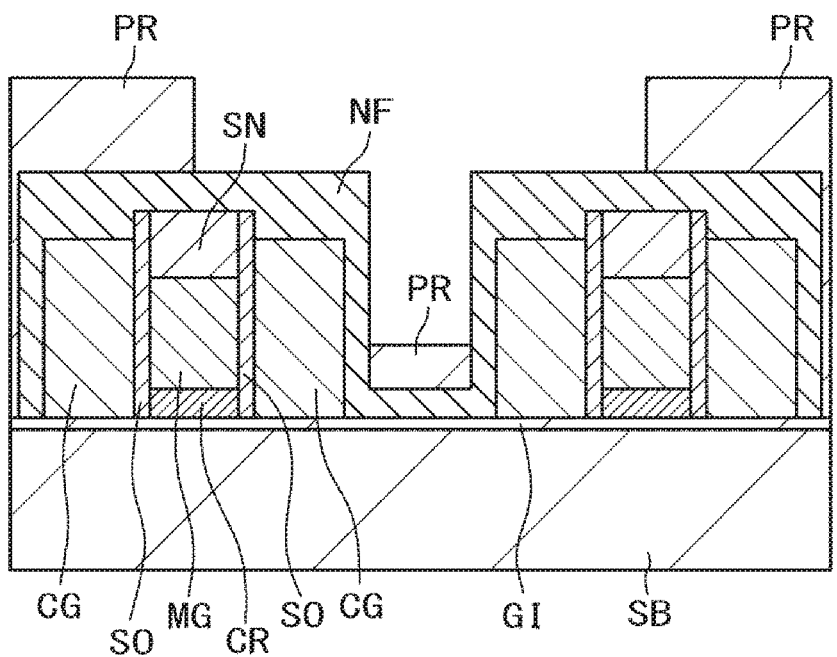
FIG. 20 is a cross-sectional view illustrating a process of manufacturing a semiconductor device following FIG. 19.

Next, as shown in FIG. 20, after a photoresist (film) PR is applied on the silicon nitride film NF, a resist mask PR for selectively removing the unnecessary control gate electrodes CG (polysilicon PS) on the source side (drain side depending on the specification of the memory cell) is formed by photolithography. At this time, the development reaction is lowered by the acid deactivation reaction on the surface of the silicon nitride film NP, and a scum residue is intentionally generated in the concave portion between the control gate electrodes CG. The scum residue between the control gate electrodes CG functions as a protective film of the gate insulating film (ISSG film) GI together with the silicon nitride film NF.

Figure 21:
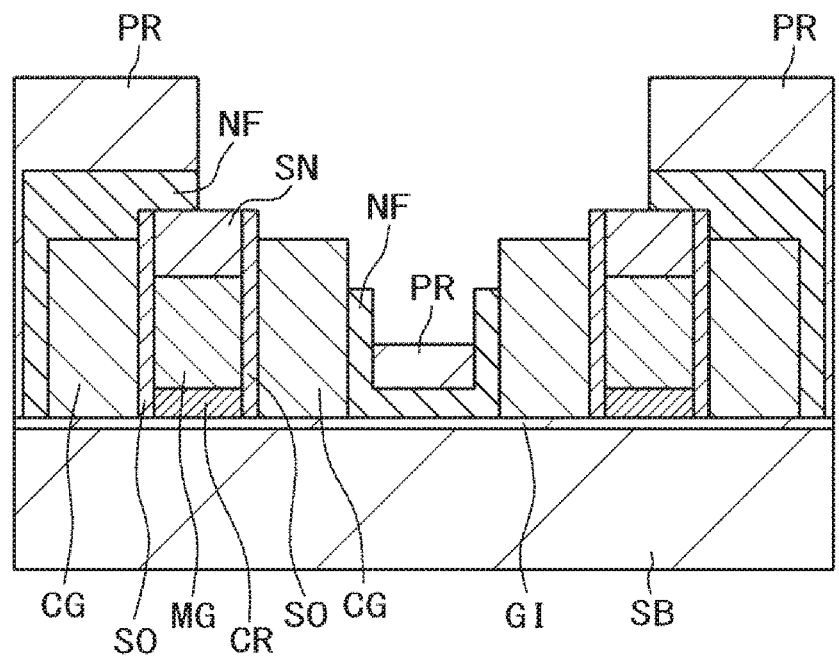
FIG. 21 is a cross-sectional view illustrating a process of manufacturing a semiconductor device following FIG. 20.

Subsequently, as shown in FIG. 21, the silicon nitride film NF is etched back by using an anisotropic etching apparatus. At this time, the carbon tetrafluoride ($CF_4$) gas is selected as the etching gas. The silicon nitride film NF is etched back to a height (for example, 180 nm to 200 nm) at which the top portions (upper surfaces) of the control gate electrodes CG (polysilicon PS) are exposed.

Figure 22:
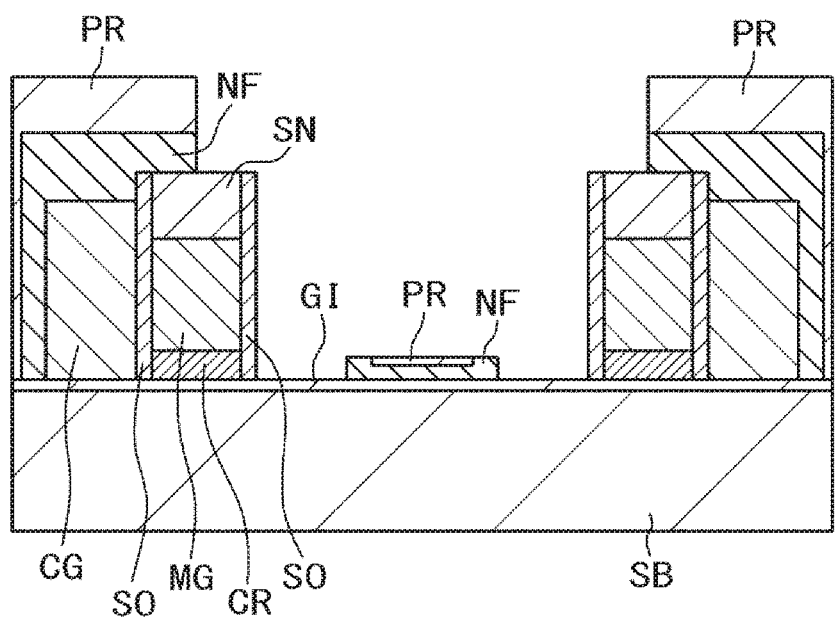
FIG. 22 is a cross-sectional view illustrating a process of manufacturing a semiconductor device following FIG. 21.

Next, as shown in FIG. 22, the semiconductor substrate SB is moved from the etching chamber of the anisotropic etching apparatus to the etching chamber of the chemical dry etching apparatus, and chemical dry etching, which isotropic etching, is performed while being covered with the resist mask PR and the silicon nitride film NF to remove the exposed control gate electrodes CG (polysilicon PS). As the etching gas at this time, $CF_4$ gas containing carbon tetrafluoride ($CF_4$) or oxygen (O) is selected.

Note that the scum residue of the photo resist PR and the silicon nitride film NF on the gate insulating film (ISSG film) GI may disappear at the same time as the control gate electrode CG (polysilicon PS) as long as the gate insulating film (ISSG film) GI can be protected during chemical dry etching of the exposed control gate electrodes CG (polysilicon PS).

Figure 23:
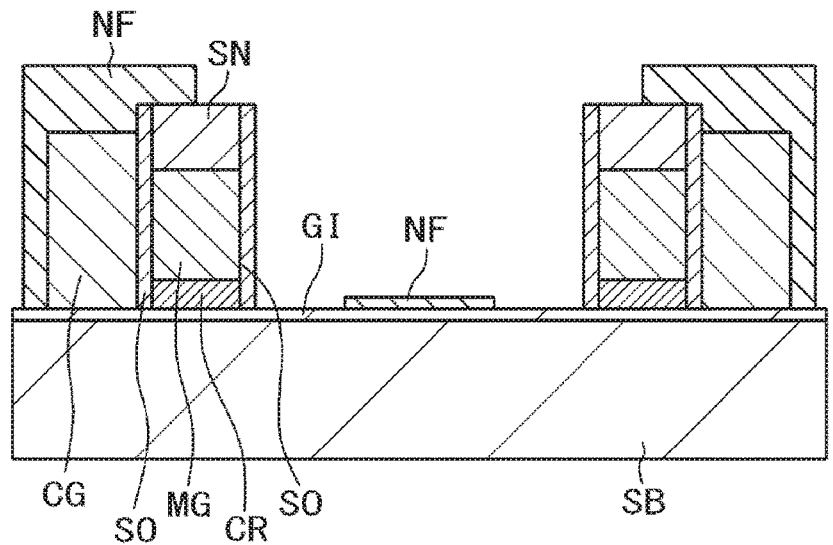
FIG. 23 is a cross-sectional view illustrating a process manufacturing a semiconductor device following FIG. 22.

Subsequently, as shown in FIG. 23, the semiconductor substrate SB is moved to the aching chamber of the ashing apparatus, and the photoresist PR and the scum residue remaining on the semiconductor substrate SB are removed.

In the present embodiment, the silicon nitride film NF used as the protective film of the gate insulating film (ISSG film) GI in the chemical dry etching of the control gate electrodes CG (polysilicon PS) can be used in a later step. For example, it is used as a cap (Cap) film of the control gate electrode CG (polysilicon PS) portion, a silicide formation preventing film when forming the metal silicide S1 on the surface of the semiconductor substrate SB, and a protective film of an insulating film (oxynitride film SO) between the control gate electrode CG and the memory gate electrode MG.

Fourth Embodiment

Figure 24:
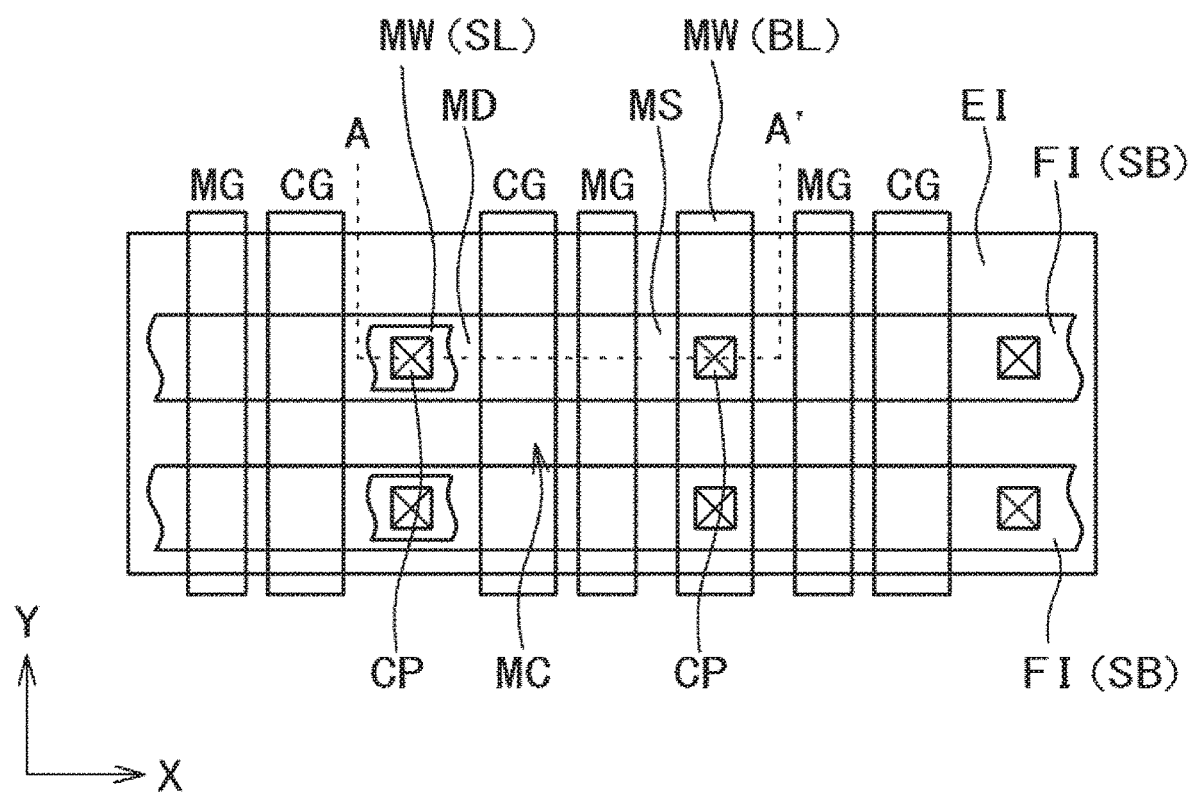
FIG. 24 is a plan view illustrating a part of a semiconductor device according to one embodiment of the present invention.
Figure 25:
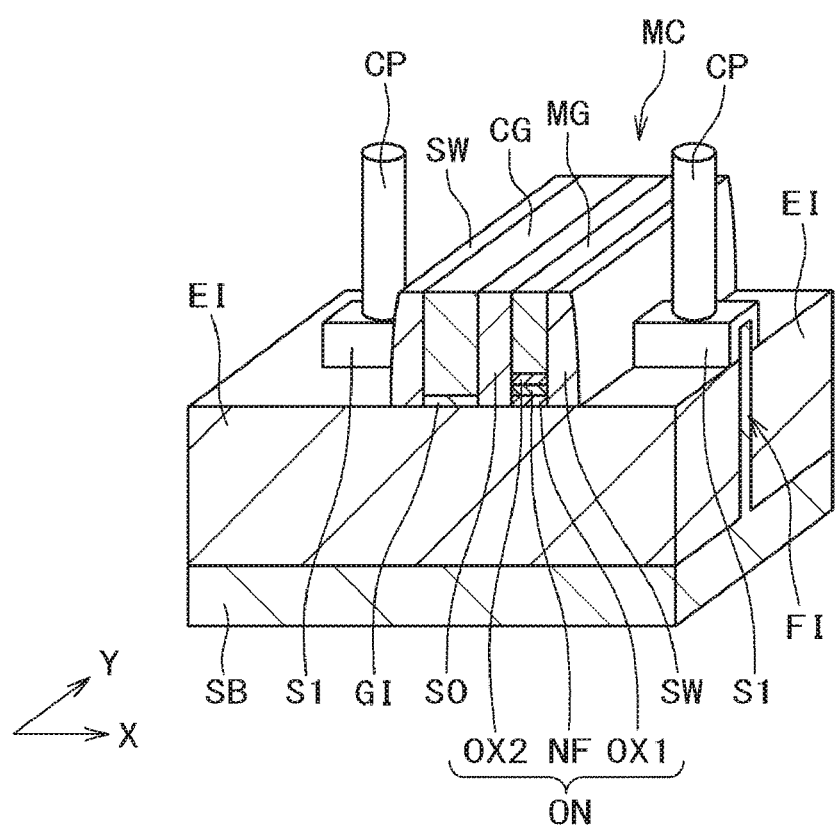
FIG. 25 is a perspective view illustrating a part of a semiconductor device according to an embodiment of the present invention.
Figure 26:
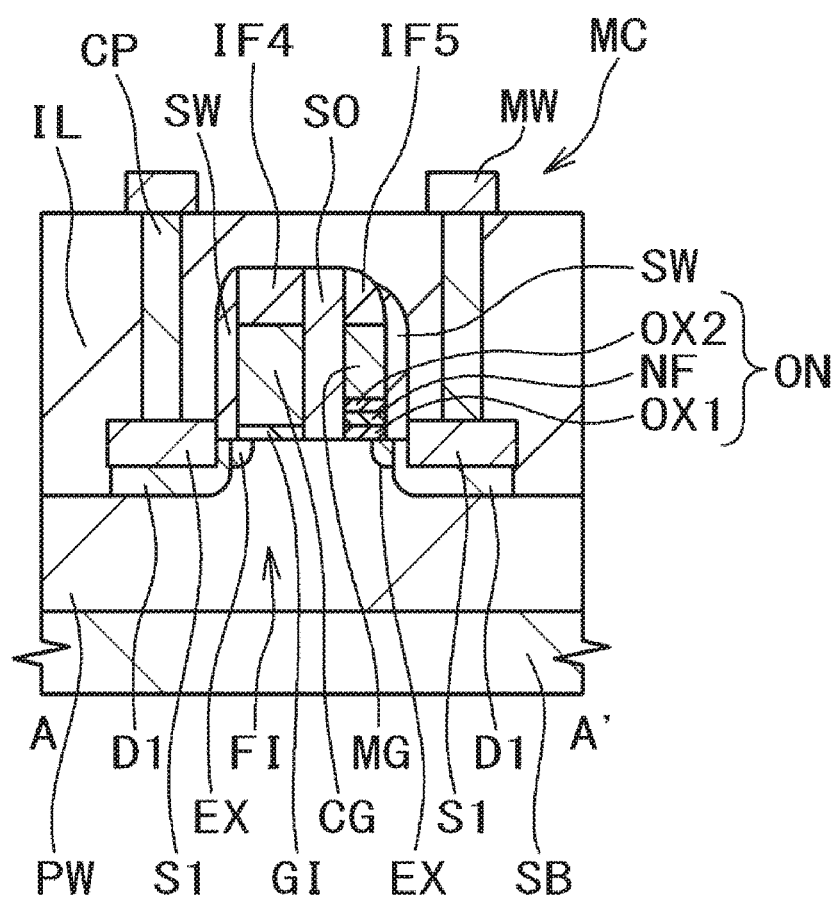
FIG. 26 is a cross-sectional view in the A-A' line of FIG. 24.

With reference to FIGS. 24 to 26, the structure of the split-gate type nonvolatile memory cell of fourth embodiment and the manufacturing method thereof will be described. The semiconductor device of the present embodiment is a split-gate type nonvolatile memory having a memory cell of a Fin type MONOS structure in which a transistor including an ONO (Oxide-Nitride-Oxide) film as a charge storage film (trapping film) is formed on a fin-shaped semiconductor substrate (protruding semiconductor layer). In the following description, an ONO (Oxide-Nitride-Oxide) film is used as the charge storage film (trapping film).

FIG. 24 is a plan view showing a memory cell array of the semiconductor device in the present embodiment. A plurality of memory cells MC are formed in the memory cell array. Hereinafter, a region in which a memory cell is formed is referred to as a memory cell region. In the memory cell region, a plurality of fins FI extending in the X direction are arranged at predetermined intervals in the Y direction. The X direction and the Y direction are directions along the main surface of the semiconductor substrate SB, and the X direction is orthogonal to the Y direction.

FIG. 25 is a perspective view of the semiconductor device of the present embodiment. In FIG. 25, the element isolation film EI, the interlayer insulating film and wiring on each element, the cap insulating film on the control gate electrode CG, and the cap insulating film on the memory gate electrode MG are omitted for easy understanding of the structure of the memory cell region. A memory cell MC is formed on the upper portion of the fin FI in the memory cell region. As shown in FIG. 25, the control gate electrode CG and the memory gate electrode MG cross the fin FI and extend in the Y direction so as to straddle the fin FI.

FIG. 26 is a cross-sectional view taken along line A-A' of FIG. 24. Although a plurality of elements are formed side by side on one fin FI, only one memory cell MC is shown on the fin FI in FIGS. 25 and 26.

The fin FI has a substantially rectangular parallelepiped protruding shape that selectively protrudes from the main surface of the semiconductor substrate SB. The fin is a part of the semiconductor substrate SB and is an active region (semiconductor layer) of the semiconductor substrate SB. When the semiconductor substrate SB is viewed from above, the space between the adjacent fins FI is filled with an element isolation film EI made of an insulating film, and the periphery of the fin FI is surrounded by the element isolation film EI. For example, STI (Shallow Trench Isolation) is used as the isolation film EI. The fin FI is an active region (semiconductor layer) for forming the memory cell MC. The semiconductor substrate SB is made of, for example, p-type single crystal silicon having a resistivity of about 1 Ωcm-10 Ωcm.

As shown in FIG. 25, the lower end portion of the FI is surrounded by an element isolation film EI covering the main surface the semiconductor substrate SB. However, a part of the fin FT protrudes above the element isolation film EI. That is, not all regions between adjacent fins are filled with the element isolation film EI.

As shown in FIG. 24, a plurality of control gate electrodes CG and a plurality of memory gate electrodes MG extending in the Y direction are arranged on the plurality of fins FI. A drain region MD on the control gate electrode CG side and a source region MS on the memory gate electrode side are formed on the upper surface of the fin FI so as to sandwich the control gate electrode CG and the memory gate electrode MG. That is, in the X direction, one control gate electrode CG and one memory gate electrode MG adjacent to each other are located between the source region MS and the drain region MD.

The drain region MD and the source region MS are n-type semiconductor regions. The drain region MD is formed between two adjacent control gate electrodes CG in the X direction, and the source region MS is formed between two adjacent memory gate electrodes MG in the X direction. The memory cell MC is a nonvolatile memory element including a control gate electrode CG, a memory gate electrode MG, a drain region MD, and a source region MS. Hereinafter, the source region MS and the drain region MD constituting one memory cell MC may be referred to as source/drain region.

Two memory cells MC adjacent to each other in the X direction share a drain region MD or a source region MS. Two memory cells MC sharing the drain region MD have line symmetry in the X direction with the drain region MD extending in the Y direction as an axis, and two memory cells MC sharing the source region MS have line symmetry in the X direction with the source region MS extending in the Y direction as an axis.

A plurality of memory cells MC arranged in the X direction ire formed in each fin FI. The drain region MD of each memory cell MC is electrically connected to a source line SL formed of a wiring MW extending in the X direction via a contact plug (via) CP formed in a contact hole penetrating an interlayer insulating film (not shown) formed on the memory cell MC. The source regions of the plurality of memory cells MC arranged in the Y direction are electrically connected to bit lines BL formed of wirings MW extending in the Y direction.

The fin FI is a substantially rectangular parallelepiped protruding semiconductor layer protruding from the main surface of the semiconductor substrate SB in a direction perpendicular to the main surface. The fin FI does not necessarily have to be rectangular parallelepiped, and the corner of the rectangle may be rounded when viewed in cross section in the short side direction. Each side surface of the fin FI may be perpendicular to the main surface of the semiconductor substrate SB, but may have an inclination angle close to perpendicular. That is, the cross-sectional shape of each of the fins FI is substantially a rectangular parallelepiped or trapezoid.

As shown in FIG. 24, when the semiconductor substrate SB is viewed from above, the direction in which the fins FI extend is the long side direction of each fin, and the direction orthogonal to the long side direction is the short side direction of each fin. That is, the length of the fin is greater than the width of the fin. The fin FI may have any shape as long as it is a protruding semiconductor layer having a length, a width, and a height. For example, it may have a serpentine layout in plan view.

As shown in FIG. 26, the upper surface of the control gate electrode CG is covered with the insulating film IF4, and the upper surface of the memory gate electrode MG covered with the insulating film IF5. Each of the insulating films IF4 and IF5 is made of, for example, a silicon nitride film. The control gate electrode CG is made of, for example, a polysilicon film, and an n-type impurity (for example, P (phosphorus) or As (arsenic)) is introduced into the polysilicon film. The memory gate electrode MG is made of, for example, a polysilicon film.

As shown in FIGS. 25 and 26, the upper surface and the side surface of the fin FI in which the diffusion region D1 constituting the source/drain region of the memory cell region is formed are covered with the silicide layer S1. The silicide layers S1 are made of, for example, nickel silicide (NiSi). The silicide layer S1 is formed of a layer extending along the upper surface and the side surface of the fin FI.

The lower portion of each side surface of the fin FI is surrounded by an element isolation film EI formed on the main surface of the semiconductor substrate SB. That is, the fins are isolated from each other by an element isolation film EI. As shown in FIG. 26, a p-type well PW, which is a p-type semiconductor region, is formed in the fin FI from the upper surface to the lower portion of the fin FI.

A control gate electrode CG is formed on the upper surface and the side surface of the fin FI via a gate insulating film GI, and a memory gate electrode MG is formed in an area adjacent to the control gate electrode CG in the long side direction (X direction) of the fin FI via an oxynitride film (SiON film) SO. An oxynitride film (SiON film) SO is interposed between the control gate electrode CG and the memory gate electrode MG, and the control gate electrode CG and the memory gate electrode MG are electrically isolated by an oxynitride film (SiON film) SO. An ONO film ON is interposed between the memory gate electrode MG and the upper surface of the fin FI. The ONO film ON continuously formed so as to cover the bottom surface of the memory gate electrode MG.

The gate insulating film GI is a thermal oxide film formed by thermally oxidizing the main surface and the side surface of the fin FI, which is the protruding semiconductor layer of the semiconductor substrate SB made of silicon, and has a thickness of, for example, 2 nm. The ONO film ON is formed of a silicon oxide film OX1 formed of a thermal oxide film (silicon oxide film) obtained by thermally oxidizing the main surface and the side surface of the fin FI which is the protruding semiconductor layer of the semiconductor substrate SB made of silicon, a silicon nitride film NF formed on the silicon oxide film OX1, and a silicon oxide film OX2 formed on the silicon nitride film NF. The silicon nitride film NF is a charge storage portion of the memory cell MC. Here, the silicon oxide film OX1 has a film thickness of, for example, 4 nm, the silicon nitride film NE has a film thickness of, for example, 7 nm, and the silicon oxide film OX2 has a film thickness of, for example, 9 nm.

That is, the ONO film ON has a stacked structure formed of a silicon oxide film OX1, a silicon nitride film NF, and a silicon oxide film OX2 stacked in this order from the upper surface side of the fin FI. The ONO film ON has a thickness of, for example, 20 nm, which is larger than the thickness of the gate insulating film GI under the control gate electrode CG. The silicon oxide film OX2 may be formed of a silicon oxynitride film (SiON film).

In the short side direction (Y direction) of the fin FI, the control gate electrode CG extends along the upper surface, the side surface, and the upper surface of the element isolation film EI of the fin FI via the gate insulating film GI. Similarly, in the short side direction of the fin FI, the memory gate electrode MG extends along the main surface and the side surface of the fin FI and the upper surface of the element isolation film EI via the ONO film ON.

The side surfaces of the pattern including the control gate electrode CG, the memory gate electrode MG, the gate insulating film GI, the ONO film ON, and the insulating films IF4 and IF5 are covered with a sidewall spacer SW. The sidewall SW has, for example, a stacked structure of a silicon nitride film and a silicon oxide film. The silicide layer S1 covers the pattern including the control gate electrode CG and the surface of the fin FI exposed from the sidewall SW.

As shown in FIG. 26, a pair of source/drain regions are formed on the upper surface of the fin FI so as to sandwich the upper surface of the fin FI immediately below the pattern including the control gate electrode CG. Each of the source region and the drain region has an extension region EX, which is an n⁻ type semiconductor region, and a diffused region D1, which an n⁺ type semiconductor region. The diffusion region D1 has a higher impurity concentration and a deeper formation depth than the extension region EX. In each of the source region and the drain region, the extension region EX and the diffusion region D1 are in contact with each other, and the extension region EX located on the upper surface of the fin FI immediately below the above-mentioned pattern, that is, on the channel region side.

The drain region MD is adjacent to the fin FI directly under the control gate electrode CG, and the source region MS is adjacent to the fin FI directly under the memory gate electrode MG. That is, of the source/drain regions sandwiching the pattern including the control gate electrode CG and the memory gate electrode MG in plan view, the drain region MD is located on the control gate electrode CG side, and the source region MS is located on the memory gate electrode MG side. In other words, in plan view, the drain region MD is adjacent to the control gate electrode CG, and the source region MS is adjacent to the memory gate electrode MG.

As described above, by forming the source/drain regions having the structure including the extension regions EX having a low impurity concentration and the diffused regions D1 having a high impurity concentration, that is, the LDD (Lightly Doped Drain) structure, the short-channel characteristics of the transistor having the source/drain regions can be improved. The source region corresponds to the source region MS shown in FIG. 24, and the drain region corresponds to the drain region MD shown in FIG. 24.

As shown in FIG. 26, an interlayer insulating film IL made of, for example, a silicon oxide film is formed on the fin FI and the element isolation film EI. The interlayer insulating film IL covers the fin FI, the element isolation film EI, the control gate electrode CG, the memory gate electrode MG, the source/drain regions MS, MD, the insulating films IF4, IF5, the sidewall SW, and the silicide layer S1. The upper surface of the interlayer insulating film IL is flattened.

A plurality of wirings MW are formed on the interlayer insulating film IL, and the wirings MW are electrically connected to the source region and the drain on of the memory cell MC via a contact plug CP provided in a contact hole penetrating the interlayer insulating film IL. The bottom surface of the contact plug CP is in direct contact with the upper surface of the silicide layer S1, and the contact plug CP is electrically connected to the source/drain region via the silicide layer S1. The silicide layer S1 has a function of reducing the connection resistance between the contact plug CP, which is a connection portion made of a metal film mainly containing tungsten (W), for example, and the source/drain regions in the fin FI made of a semiconductor.

In a power supply region (not shown) of the control gate electrode CG, the insulating film IF4 on the control gate electrode CG is removed, and the contact plug CP is connected to the upper surface of the control gate electrode CG via a silicide layer. In a power supply region (not shown) of the memory gate electrode MG, the insulating film IF5 on the memory gate electrode MG is removed, and the contact plug CP is connected to the upper surface of the memory gate electrode MG via a silicide layer.

The memory cell MC is a nonvolatile memory element having a control gate electrode CG, a memory gate electrode MG, a drain region, and a source region. The control gate electrode CG and the source/drain region constitute a control transistor (CG-MOS), the memory gate electrode MG and the source drain region constitute a memory transistor (MG-MOS), and the memory cell MC includes a control transistor (CG-MOS) and a memory transistor (MG-MOS). That is, the control transistor (CG-MOS) and the memory transistor (MG-MOS) share a source/drain region. The distance between the drain region and the source region in the gate length direction (X direction) of the control gate electrode CG and the memory gate electrode MG corresponds to the channel length of the memory cell MC. The control transistor and the memory transistor are FinFET having the surfaces of the fins FI as channels.

In the manufacturing process of the Fin type MONOS structure of the present embodiment, the manufacturing methods described in any of first embodiment to third embodiment are used. For example, as described in the first embodiment, by forming the organic film OF between the control gate electrodes CG adjacent to each other and protecting the gate insulating film GI between the control gate electrodes CG, damage to the gate insulating film GI at the time of removing the control gate electrodes CG is suppressed, and it is possible to reliably remove the polysilicon film PS of the control gate electrode CG and to protect the gate insulating film GI at the same time.

As in the present embodiment, when a fin type MONOS structure is used as the memory cell structure, it is essential to reduce damage to semiconductor substrate SB (fin FI). As described in first embodiment to third embodiment, by protecting the gate insulating film GI exposed at the time of removing the unnecessary control gate electrodes CG (polysilicon PS) with an organic film OF or a scum residue of the silicon nitride film NF, it is possible to improve the reliability and the manufacturing yield of the split-gate type nonvolatile memory having the memory cell of the Fin-type MONOS structures.

Although the invention made by the present inventor has been specifically described based on the embodiments, the present invention is not limited to the embodiments described above, and it is needless to say that various modifications can be made without departing from the gist thereof.

What is claimed is:
1. A method of manufacturing a semiconductor device comprising:
(a) forming a plurality of first gate electrodes on a main surface of a semiconductor substrate via a first gate insulating film;
(b) forming a second gate insulating film between the plurality of first gate electrodes by performing an oxidation to the main surface;
(c) forming second gate electrodes on both sides of each of the first gate electrodes via an insulating film and, over the main surface via the second gate insulating film;

(d) after the step (c), forming a protection film on the main surface so as to cover the second gate insulating film between the second gate electrodes adjacent to each other;

(e) after the step (d), applying a photoresist film on the main surface and forming a mask pattern by photolithography;

(f) after the step (e), performing a first dry etching to etch back the protection film at an opening portion of the mask pattern; and (g) after the step (f), performing a second dry etching to the main surface to remove the second gate electrode.

2. The method of manufacturing the semiconductor device according to claim 1, wherein in the step (f), the protection film is etched back until a part of a side surface of the second gate electrode is exposed.

3. The method of manufacturing the semiconductor device according to claim 1, wherein in the step (f), the protection film is etched back until an upper surface of the second gate electrode is exposed.

4. The method of manufacturing the semiconductor device according to claim 1, wherein the protection film is an organic resin containing an alcoholic hydroxyl group.

5. The method of manufacturing the semiconductor device according to claim 4, wherein mixed gas of oxygen gas and sulfurous acid gas is used in the first dry etching.

6. The method of manufacturing the semiconductor device according to claim 5, wherein carbon tetrafluoride gas is used in the second dry etching.

7. The method of manufacturing the semiconductor device according to claim 5, wherein mixed gas of hydrogen bromide gas and oxygen gas is used in the second dry etching.

8. The method of manufacturing the semiconductor device according to claim 7, wherein the first dry etching and the second dry etching are consistently performed within a same etching chamber of an anisotropic polysilicon etching apparatus by switching gases introduced into the etching chamber.

9. The method of manufacturing the semiconductor device according to claim 8, further comprising a step of:

(h) after the step (g), performing an ashing on the main surface to remove the mask pattern, wherein the ashing is performed in an in-line type ashing chamber built in the anisotropic polysilicon etching apparatus.

10. The method of manufacturing the semiconductor device according to claim 1, wherein the protection film is a silicon nitride film.

11. The method of manufacturing the semiconductor device according to claim 10, wherein carbon tetrafluoride gas is used in the first dry etching.

12. The method of manufacturing the semiconductor device according to claim 11, wherein carbon tetrafluoride gas is used in the second dry etching.

13. The method of manufacturing the semiconductor device according to claim 1, wherein the semiconductor substrate has a protruding semiconductor layer being a part of the semiconductor substrate, the protruding semiconductor layer protruding from the main surface and extending along the main surface, and wherein the first gate electrode and the second gate electrode are formed on an upper surface of the protruding semiconductor layer.

14. The method of manufacturing the semiconductor device according to claim 1, wherein the first gate insulating film is a stacked film formed of an aluminum oxide film, a hafnium silicate film and a silicon oxide film in order from the main surface.

15. The method of manufacturing the semiconductor device according to claim 1, wherein the first gate insulating film is a stacked film formed of a silicon oxide film, a silicon nitride film and a silicon oxide film in order from the main surface.

* * * * *